US010762967B2

(12) United States Patent
Shappir et al.

(10) Patent No.: US 10,762,967 B2
(45) Date of Patent: Sep. 1, 2020

(54) RECOVERING FROM FAILURE IN PROGRAMMING A NONVOLATILE MEMORY

(71) Applicant: Apple Inc., Cupertino, CA (US)

(72) Inventors: Assaf Shappir, Ganey Tikva (IL); Barak Baum, Givatayim (IL); Itay Sagron, Gedera (IL); Roman Guy, Ashkelon (IL); Guy Ben-Yehuda, Hod Hasharon (IL); Stas Mouler, Kfar Saba (IL)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 16/202,130

(22) Filed: Nov. 28, 2018

(65) Prior Publication Data

US 2020/0005874 A1     Jan. 2, 2020

Related U.S. Application Data

(60) Provisional application No. 62/690,976, filed on Jun. 28, 2018.

(51) Int. Cl.
    *G11C 16/10*        (2006.01)
    *G11C 16/34*        (2006.01)
    (Continued)

(52) U.S. Cl.
    CPC ........ *G11C 16/105* (2013.01); *G06F 11/1072* (2013.01); *G11C 16/26* (2013.01);
    (Continued)

(58) Field of Classification Search
    CPC ............ G06F 16/3431; G06F 16/3459; G06F 16/3463
    See application file for complete search history.

(56) References Cited

U.S. PATENT DOCUMENTS

| 4,841,482 A | 6/1989 | Kreifels |
| 5,181,025 A | 1/1993 | Ferguson et al. |
| (Continued) | | |

OTHER PUBLICATIONS

Yazovitsky et al., U.S. Appl. No. 16/202,127, filed Nov. 28, 2018.
U.S. Appl. No. 16/202,127 office action dated Dec. 11, 2019.

*Primary Examiner* — Edward J Dudek, Jr.
(74) *Attorney, Agent, or Firm* — Kligler & Associates Patent Attorneys Ltd

(57) ABSTRACT

A controller includes an interface and a processor. The interface is configured to communicate with a nonvolatile memory including multiple memory cells organized in multiple memory blocks that each includes multiple Word Lines (WLs). The processor is configured to store first data in one or more WLs of a memory block, the first data occupies less than a maximal number of WLs available in the memory block, to calculate redundancy data over the first data and store the redundancy data in a dedicated memory, to program second data to a selected WL of the memory block that was not programmed with the first data, to check a programming status resulting from the programming of the selected WL, and in response to identifying that programming the second data to the selected WL has corrupted at least part of the first data, to recover the first data using the redundancy data.

26 Claims, 4 Drawing Sheets

(51) Int. Cl.
   *G11C 16/26* (2006.01)
   *G06F 11/10* (2006.01)
   *G11C 29/12* (2006.01)

(52) U.S. Cl.
   CPC .......... *G11C 16/3459* (2013.01); *G11C 29/12* (2013.01); *G06F 11/108* (2013.01); *G11C 2029/1202* (2013.01)

(56) References Cited

U.S. PATENT DOCUMENTS

| | | |
|---|---|---|
| 5,331,594 A | 7/1994 | Hotta |
| 5,372,712 A | 12/1994 | Petit |
| 5,428,621 A | 6/1995 | Mehrotra et al. |
| 5,440,516 A | 8/1995 | Slemmer |
| 5,581,509 A | 12/1996 | Golla et al. |
| 5,602,778 A | 2/1997 | Futatsuya et al. |
| 5,606,527 A | 2/1997 | Kwack et al. |
| 5,684,747 A | 11/1997 | Urai |
| 5,748,545 A | 5/1998 | Lee et al. |
| 5,796,653 A | 8/1998 | Gaultier |
| 5,847,995 A | 12/1998 | Kobayashi et al. |
| 5,898,637 A | 4/1999 | Lakhani et al. |
| 6,031,772 A | 2/2000 | Nagatomo |
| 6,545,910 B2 | 4/2003 | Byeon et al. |
| 6,650,585 B2 | 11/2003 | Chevallier |
| 6,707,078 B1 | 3/2004 | Shiraiwa et al. |
| 6,813,183 B2 | 11/2004 | Chevallier |
| 7,089,460 B2 | 8/2006 | Fu |
| 7,212,454 B2 | 5/2007 | Kleveland et al. |
| 7,319,623 B1 | 1/2008 | Yuan et al. |
| 7,440,347 B1 | 10/2008 | Vogelsang |
| 7,463,529 B2 | 12/2008 | Matsubara |
| 7,856,528 B1 | 12/2010 | Frost et al. |
| 7,873,803 B2 | 1/2011 | Cheng |
| 8,176,284 B2 | 5/2012 | Frost et al. |
| 8,305,807 B2 | 11/2012 | Shah et al. |
| 8,379,454 B2 | 2/2013 | Kochar et al. |
| 8,432,732 B2 | 4/2013 | Li et al. |
| 8,473,780 B2 | 6/2013 | Shalvi |
| 8,478,796 B2 | 7/2013 | Post et al. |
| 8,514,630 B2 | 8/2013 | Huynh et al. |
| 8,645,749 B2 | 2/2014 | Reche |
| 8,645,776 B2 | 2/2014 | Byom et al. |
| 8,730,722 B2 | 5/2014 | Koh et al. |
| 8,732,557 B2 | 5/2014 | Ratnam et al. |
| 8,767,459 B1 | 7/2014 | Kasorla et al. |
| 8,775,901 B2 | 7/2014 | Sharon et al. |
| 8,832,357 B2 | 9/2014 | Yao et al. |
| 8,892,981 B2 | 11/2014 | Post et al. |
| 8,902,657 B2 | 12/2014 | Iwai et al. |
| 8,977,813 B2 | 3/2015 | Burd |
| 9,021,339 B2 | 4/2015 | Lu et al. |
| 9,021,343 B1 | 4/2015 | Hu et al. |
| 9,032,272 B2 | 5/2015 | Yoon et al. |
| 9,053,809 B2 | 6/2015 | Anholt et al. |
| 9,058,261 B1 | 6/2015 | Jean et al. |
| 9,092,363 B2 | 7/2015 | Avila et al. |
| 9,105,349 B2 | 8/2015 | Avila et al. |
| 9,128,822 B2 | 9/2015 | Michael et al. |
| 9,135,112 B2 | 9/2015 | Chen et al. |
| 9,177,610 B2 | 11/2015 | D'Abreu et al. |
| 9,330,783 B1 | 5/2016 | Rotbard et al. |
| 9,355,713 B2 | 5/2016 | Huang et al. |
| 9,390,809 B1 | 7/2016 | Shur et al. |
| 9,406,346 B2 | 8/2016 | D'Abreu et al. |
| 9,454,429 B2 | 9/2016 | Ojalvo et al. |
| 9,489,263 B2 | 11/2016 | Hyun et al. |
| 9,529,663 B1 | 12/2016 | Srinvasan et al. |
| 9,619,321 B1 | 4/2017 | Haratsch et al. |
| 9,811,413 B2 | 11/2017 | Ojalvo et al. |
| 9,959,168 B2 | 5/2018 | Achtenberg et al. |
| 9,984,771 B2 | 5/2018 | Bonke |
| 9,996,417 B2 | 6/2018 | Shappir et al. |
| 2002/0174295 A1 | 11/2002 | Ulrich et al. |
| 2008/0052446 A1 | 2/2008 | Lasser et al. |
| 2009/0225607 A1 | 9/2009 | Chen et al. |
| 2010/0128525 A1 | 5/2010 | Mokhlesi |
| 2010/0329052 A1 | 12/2010 | Chen et al. |
| 2011/0066793 A1 | 3/2011 | Burd |
| 2011/0209028 A1 | 8/2011 | Post et al. |
| 2012/0159281 A1 | 6/2012 | Shalvi et al. |
| 2013/0024748 A1 | 1/2013 | Sharon et al. |
| 2013/0031429 A1* | 1/2013 | Sharon ................ G06F 11/1048 714/718 |
| 2013/0117606 A1 | 5/2013 | Anholt et al. |
| 2013/0229868 A1 | 9/2013 | Koh et al. |
| 2013/0268724 A1 | 10/2013 | Seo et al. |
| 2013/0294168 A1 | 11/2013 | Shirakawa |
| 2014/0047291 A1 | 2/2014 | Shalvi et al. |
| 2014/0095259 A1 | 3/2014 | Tam et al. |
| 2014/0157078 A1 | 6/2014 | Danilak et al. |
| 2014/0189421 A1 | 7/2014 | Werner et al. |
| 2014/0189438 A1 | 7/2014 | Arbel et al. |
| 2014/0254264 A1 | 9/2014 | Dutta et al. |
| 2014/0269071 A1 | 9/2014 | Pandya et al. |
| 2014/0321202 A1 | 10/2014 | Yang et al. |
| 2015/0154069 A1* | 6/2015 | Tuers ................ G06F 11/1072 714/773 |
| 2015/0178150 A1 | 6/2015 | Silberman et al. |
| 2016/0034353 A1 | 2/2016 | Tuers et al. |
| 2016/0098216 A1 | 4/2016 | Huang et al. |
| 2019/0095116 A1 | 3/2019 | Igahara et al. |
| 2019/0198113 A1 | 6/2019 | Ben-Rubi et al. |
| 2019/0317672 A1 | 10/2019 | Linnen et al. |

* cited by examiner

RECOVERING FROM FAILURE IN PROGRAMMING A NONVOLATILE MEMORY

CROSS-REFERENCE TO RELATED APPLICATIONS

This application claims the benefit of U.S. Provisional Patent Application 62/690,976, filed Jun. 28, 2018, whose disclosure is incorporated herein by reference.

TECHNICAL FIELD

Embodiments described herein relate generally to data storage, and particularly to methods and systems for recovering data lost during the programming of a nonvolatile memory.

BACKGROUND

Non-Volatile Memory (NVM) devices are subject to various failures, e.g., due to imperfect manufacturing process. Such failures include, for example, word-line to substrate and word-line to word-line short or leakage, which may result in data loss in programming, reading or both.

Methods for avoiding data loss in programming NVM devices are known in the art. For example, U.S. Patent Application Publication 2013/0117606, whose disclosure is incorporated herein by reference, describes a method that includes calculating redundancy information over a set of data items, and sending the data items for storage in a memory. The redundancy information is retained only until the data items are written successfully in the memory, and then discarded. The data items are recovered using the redundancy information upon a failure in writing the data items to the memory.

U.S. Patent Application Publication 2013/0229868 describes techniques of operating a non-volatile memory so that in case data that would otherwise be lost in the case of a word line to word line short is preserved. Before writing a word line, the data from a previously written adjacent word line is read back and stored in data latches associated with the corresponding bit lines, but that are not being used for the data to be written. If a short occurs, as the data for both word lines is still in the latches, it can be written to a new location.

SUMMARY

An embodiment that is described herein provides a controller, including an interface and a processor. The interface is configured to communicate with a nonvolatile memory including multiple memory cells organized in multiple memory blocks. Each memory block includes multiple Word Lines (WLs) of the memory cells. The processor is configured to receive first data, and store the first data in one or more WLs of a given memory block, the first data occupies less than a maximal number of WLs available in the given memory block, to calculate redundancy data over the first data, and store the redundancy data in a dedicated memory, to receive second data and program the second data to a selected WL of the given memory block that was not programmed with the first data, to check a programming status resulting from the programming of the selected WL, and in response to identifying that programming the second data to the selected WL has corrupted at least part of the first data, to recover the first data using the redundancy data.

In some embodiments, in response to identifying that the second data has been programmed successfully and that programming the second data has filled the given memory block completely, the processor is configured to discard the redundancy data from the dedicated memory. In other embodiments, the processor is configured to identify that programming the second data has corrupted the first data by receiving a program failure indication from the nonvolatile memory. In yet other embodiments, the processor is configured to identify that programming the second data has corrupted the first data by reading and verifying the first data.

In an embodiment, the memory blocks support programming a first number of bits per memory cell, the dedicated memory includes one or more selected memory blocks in the nonvolatile memory, and the processor is configured to program the redundancy data to the one or more selected memory blocks using a second number of bits per memory cell smaller than or equal to the first number. In another embodiment, the dedicated memory includes an auxiliary nonvolatile memory, which resides externally to the nonvolatile memory and is accessible to the controller. In yet another embodiment, the dedicated memory includes an auxiliary volatile memory, and the processor is configured to recover the redundancy data after system power is lost and then resumes, by recovering the redundancy data based on the first data, and storing the recovered redundancy data in the volatile memory.

In some embodiments, the memory blocks are organized in multiple planes whose WLs are accessible in parallel, and the processor is configured to calculate multiple plane-specific redundancy chunks for respective memory blocks belonging to different respective planes. In other embodiments, the processor is configured to recover a WL whose programming to multiple memory blocks in multiple respective planes has failed, using the multiple plane-specific redundancy chunks. In yet other embodiments, in response to identifying that programming the second data has filled the given memory block completely, the processor is configured to calculate for the given memory block permanent redundancy data, smaller than the redundancy data, and to store the permanent redundancy data in the nonvolatile memory.

In an embodiment, the processor is configured to calculate the redundancy data by applying bit-wise XOR operations among WLs programmed with the first data, and to calculate the permanent redundancy data by applying bit-wise XOR operations over the redundancy data. In another embodiment, the processor is configured to calculate the permanent redundancy data from the redundancy data by reading at least part of the first data from the memory block, and applying ECC encoding to the redundancy data and to the at least part of the first data that was read. In yet another embodiment, the processor is configured to allocate at least a portion of a storage space of the dedicated memory from a predefined pool of multiple spare memory blocks.

In some embodiments, the dedicated memory comprises the nonvolatile memory or an auxiliary memory accessible to the controller, and the processor is configured to select a memory for storing the redundancy data, between the nonvolatile memory and the auxiliary memory, and to store the redundancy data in the selected memory. In other embodiments, the controller and the nonvolatile memory are comprised in a storage system, and the processor is configured to select the memory for storing the redundancy data, at power up, based on a configuration of the storage system. In yet other embodiments, the processor is configured to select the memory for storing the redundancy data based on a criterion that aims to maximize at least one of (i) a writing throughput to the nonvolatile memory and (ii) a number of programming and erasure cycles that the nonvolatile memory sustains.

In an embodiment, the processor is configured to move at least some of redundancy data previously written to one of the nonvolatile memory and the auxiliary memory to the other one of the nonvolatile memory and the auxiliary memory, based on evaluating storage space availability in at least one of the nonvolatile memory and the auxiliary memory. In another embodiment, the processor is configured to hold a table for translating between logical addresses used by a host coupled to the controller and physical addresses used by the nonvolatile memory, to check a fragmentation level of the table, and in response to detecting that the fragmentation level exceeds a predefined fragmentation threshold, to select the nonvolatile memory for storing the redundancy data.

In some embodiments, the processor is configured to allocate in the auxiliary memory a given storage space to be shared between (i) a write buffer for storing data pending programming to the nonvolatile memory and (ii) a storage area for storing redundancy data, to estimate a writing rate to the write buffer, and to re-allocate the write buffer and the storage area, based on the estimated writing rate.

There is additionally provided, in accordance with an embodiment that is described herein, a method for data storage, including, in a controller that communicates with a nonvolatile memory including multiple memory cells organized in multiple memory blocks, each memory block includes multiple Word Lines (WLs) of the memory cells, receiving first data, and storing the first data in one or more WLs of a given memory block, the first data occupies less than a maximal number of WLs available in the given memory block. Redundancy data is calculated over the first data, and the redundancy data is stored in a dedicated memory. Second data is received and the second data is programmed to a selected WL of the given memory block that was not programmed with the first data. A programming status resulting from the programming of the selected WL is checked. In response to identifying that programming the second data to the selected WL has corrupted at least part of the first data, the first data is recovered using the redundancy data.

These and other embodiments will be more fully understood from the following detailed description of the embodiments thereof, taken together with the drawings in which:

DETAILED DESCRIPTION OF EMBODIMENTS

Overview

Figure 1:
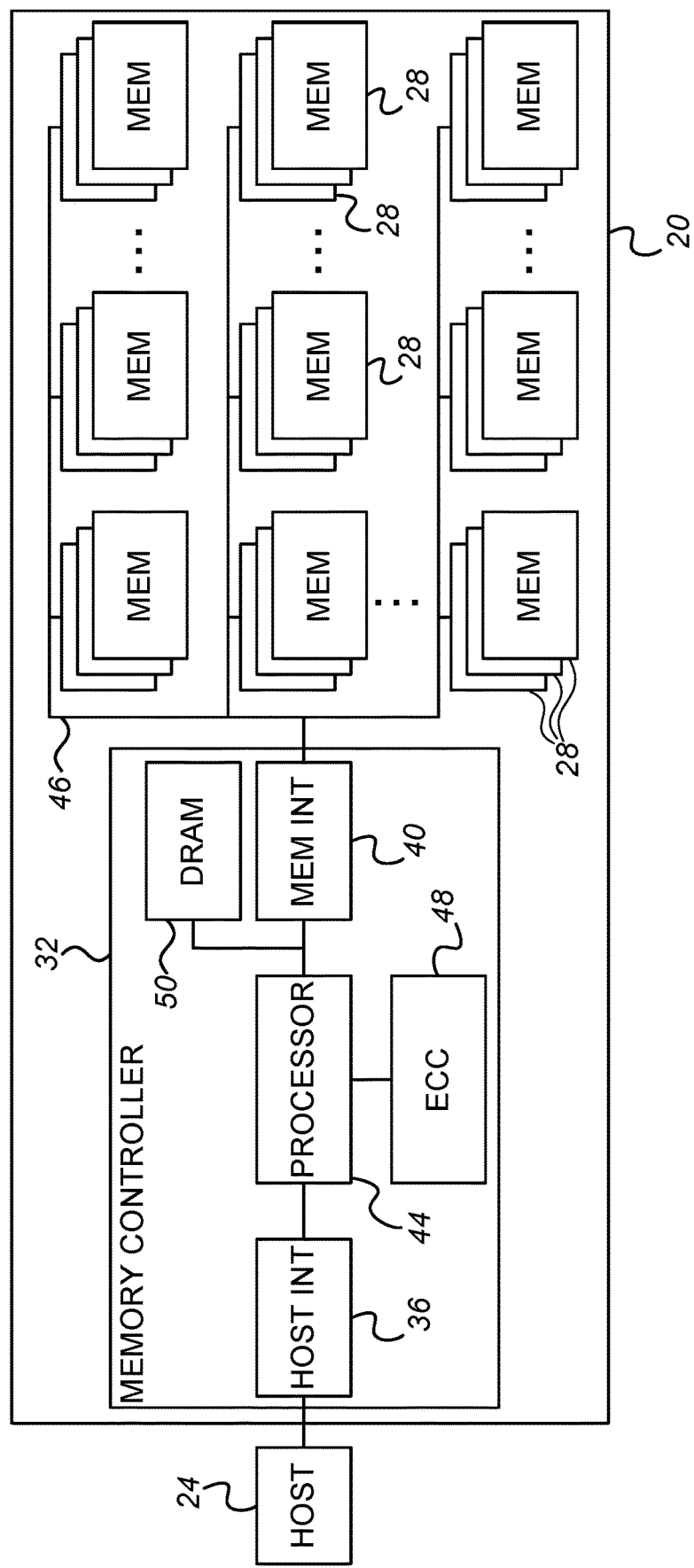
FIG. 1 is a block diagram that schematically illustrates a memory system, in accordance with an embodiment that is described herein.

Embodiments that are described herein provide methods and systems for recovering data lost in programming a nonvolatile memory. In the disclosed embodiments, a controller stores data in a nonvolatile memory comprising multiple memory cells that are organized in multiple memory blocks, wherein each of the memory blocks comprises multiple Word Lines (WLs) of the memory cells. To prevent data loss, information for recovering the data being programmed should be retained until verifying that the data has been programmed successfully.

In principle, the controller could store data to be programmed in a buffer of the nonvolatile memory, wherein the memory device then programs the buffered data to target locations in the nonvolatile memory. After verifying correct programming, the controller would discard the redundancy information, to release the buffer to be reused. This approach requires saving a full copy of the data until verification, and incurs long programming delays and high power consumption because the data is initially buffered, rather than programmed directly to the nonvolatile memory.

In another approach, the controller calculates redundancy information over a group of memory blocks that are fully programmed, and stores respective redundancy information permanently in other memory blocks. The controller can then recover from a read failure using the redundancy information. This approach is typically inapplicable in small to medium storage devices because of the large amount of redundancy information stored.

In some embodiments, defects in the nonvolatile memory may cause various types of failures. A WL-to-WL short or leakage is likely to cause a read failure in a small number of WLs within the same memory block, or in a single WL across multiple planes. In contrast, a programming operation involves applying high voltage levels to the memory cells being programmed in a given WL, which may result in corrupting data that has been previously programmed to other WLs in the same memory block, or to the same WL in other planes. A nonvolatile memory in a Three-Dimensional (3D) configuration is prone to manufacturing defects, such as a WL to Common Source Line (CSL) short or leakage, which may result in losing an entire 3D memory block.

In some embodiments, in programming a given memory block, the controller stores first data in one or more WLs of the given memory block, wherein the first data occupies less than the entire WLs available in that memory block, i.e., the memory block is not fully written. To protect the first data, the controller calculates redundancy data over the first data, and stores the redundancy data in a dedicated memory. The controller typically stores the first data incrementally, e.g., one WL or less at a time, and updates the redundancy data accordingly. Subsequently, the controller programs second data to a selected WL of the given memory block that was not programmed with the first data, and checks a programming status resulting from the programming of the selected WL. In response to identifying that programming the second data to the selected WL has corrupted at least part of the first data, the controller recovers the first data using the redundancy data. The redundancy data calculated for recovering partially programmed memory blocks is also referred to herein as "temporary redundancy data."

In some embodiments, in response to identifying that the second data has been programmed successfully and that programming the second data has filled the given memory block completely, the controller discards the redundancy data from the dedicated memory. The controller protects the fully programmed memory block by calculating for the given memory block permanent redundancy data, and stores the permanent redundancy data in the nonvolatile memory. In some embodiments, the memory system comprises a small or medium storage system, in which case the permanent redundancy data is typically much smaller than the temporary redundancy data, therefore providing partial protection coverage. Alternatively, in a large storage system comprising a massive storage area, full redundancy data can be stored for the fully programmed memory blocks, for improved protection coverage. In an embodiment, the controller calculates the permanent redundancy data from the redundancy data, e.g., using bit-wise XOR operations.

In an embodiment, the controller identifies that programming the second data has corrupted the first data, by receiving a program failure indication from the nonvolatile memory, or by reading and verifying the first data.

In some embodiments, the controller uses different storage modes in programming user data and redundancy data to the nonvolatile memory. For example, the controller stores user data in a multi-bit per cell mode, and redundancy data in a single-bit per cell mode, which is faster and more reliable.

In some embodiments, the dedicated memory that stores the redundancy data comprises a volatile memory such as a Dynamic Random Access Memory (DRAM). In such embodiments, the memory controller recovers the redundancy data after system power is lost and then resumed, by recovering the redundancy data based on the first data and storing the recovered redundancy data in the volatile memory. In some embodiments, the controller programs redundancy data to the nonvolatile memory before power is lost and reads the redundancy data back from the nonvolatile memory after power resumes. In other embodiments, the controller recovers lost redundancy data after power is resumed based on the first data in the nonvolatile memory. Note that recovering the redundancy data based on the first data is only possible when the data used for this recovery operation is available uncorrupted.

The memory controller may store the temporary redundancy data in the nonvolatile memory or in an auxiliary memory accessible to the controller. The auxiliary memory may be volatile or nonvolatile. Selecting the actual memory for the temporary redundancy data typically involves a tradeoff between storage space availability and the writing throughput and endurance of the nonvolatile storage. The controller may select the memory for storing the temporary redundancy data once at power up, e.g., based on system configuration, or dynamically, based on various conditions that change over time.

In general, preferring the auxiliary memory for storing the temporary redundancy data is advantageous in terms of the writing throughput and endurance of the nonvolatile storage. This, however, is not always possible, for example, when the auxiliary memory has a relatively small capacity, which the controller typically uses for other purposes. As such, the controller may move already written temporary redundancy data between the auxiliary memory and the nonvolatile storage based on storage space availability. Several embodiments in which the controller selects a memory for storing the temporary redundancy data will be described further below.

In the disclosed techniques, the controller stores redundancy data temporarily for recovering already programmed data that has been corrupted during programming. The controller manages the storage space efficiently by consuming minimal storage space for verifying successful programming and by applying an efficient permanent redundancy scheme for protecting the programmed data from common read failures.

System Description

FIG. 1 is a block diagram that schematically illustrates a memory system 20, in accordance with an embodiment that is described herein. Memory system 20 accepts data for storage from a host 24 and stores it in memory, and retrieves data from memory and provides it to the host. In the present example, memory system 20 comprises a Solid-State Disk (SSD) that stores data for a host computer. In alternative embodiments, however, memory system 20 may be used in any other suitable application and with any other suitable host, such as in computing devices, cellular phones or other communication terminals, removable memory modules, Secure Digital (SD) cards, Multi-Media Cards (MMC) and embedded MMC (eMMC), Flash storage based on the Universal Flash Storage (UFS) and UFS Card standards, digital cameras, music and other media players and/or any other system or device in which data is stored and retrieved.

Memory system 20 comprises multiple memory devices 28, each comprising multiple memory cells. In the present example, devices 28 comprise non-volatile NAND Flash devices, although any other suitable memory type, such as NOR and Charge Trap Flash (CTF) Flash cells, phase change RAM (PRAM, also referred to as Phase Change Memory—PCM), Nitride Read Only Memory (NROM), Ferroelectric RAM (FRAM), resistive RAM (RRAM or ReRAM), magnetic RAM (MRAM) and/or Dynamic RAM (DRAM) cells, can also be used.

Schemes for recovering corrupted data such as Redundant Array of Independent Disks (RAID) and other schemes, as will be described below, are typically incorporated within mass storage applications, such as storage based on NAND technology, Hard Disk Drive (HDD), 3D XPoint (3DXP) non-volatile memory technology by Intel and Micron—based on Phase-Change Memory (PCM) technology, and the like.

In some embodiments, the memory cells of memory devices 28 comprise analog memory cell that hold a continuous, analog value of a physical parameter, such as an electrical voltage or charge. Any suitable type of analog memory cells, such as the types listed above, can be used. In the present example, each memory device 28 comprises a non-volatile memory of NAND Flash cells. The charge levels stored in the cells and/or the analog voltages or currents written into and read out of the cells are referred to herein collectively as analog values or storage values.

Memory system 20 stores data in the memory cells by programming the cells to assume respective memory states, which are also referred to as programming levels. The programming levels are selected from a finite set of possible levels, and each level corresponds to a certain nominal storage value. For example, a 2 bit/cell Multi-Level Cell (MLC) device can be programmed to assume one of four possible programming levels by writing one of four possible nominal storage values into the cell. Similarly, a 1 bit/cell device, a 3 bit/cell device and a 4 bit/cell device are also referred to respectively as a Single-Level Cell (SLC) device, a Tri-Level Cell (TLC) device and a Quad-Level Cell (QLC)

device, can be programmed to assume one of two, eight and sixteen possible programming levels, respectively. Note that memory cells operable in MLC mode can also be used in SLC mode, e.g., for increased storage reliability and fast programming and reading.

In Flash memory devices, the memory cells are typically arranged in rows and columns. Typically, a given memory device comprises multiple erasure blocks (also referred to as memory blocks, or simply blocks, for brevity), e.g., groups of memory cells that are erased together. Data typically cannot be reprogrammed in-place, and memory blocks are therefore erased before being programmed with other data. Data is typically programmed to groups of memory cells, and retrieved from the groups of the memory cells in data units that are referred to as data pages, or simply pages, for brevity.

In some embodiments, each page comprises an entire row of the array, also referred to as a Word Line (WL). In alternative embodiments, each row (word line) can be divided into two or more pages. For example, in some devices each row is divided into two pages, one comprising the odd-order cells and the other comprising the even-order cells. In some embodiments, memory pages are sub-divided into sectors. In a 3D configuration, each row may be divided into multiple pages, comprising multiple 3D NAND strings.

In some embodiments, a given memory die comprises multiple memory arrays that are referred to as planes, and it is possible to program multiple pages into multiple respective planes in parallel. Typically, failing word lines can cause failure to word lines within the planes of a given die, but not with the planes of other dies.

Each memory device 28 may comprise a packaged device or an unpackaged semiconductor chip or die. A typical SSD may comprise a number of memory devices, each having a capacity of 32 gigabytes, for example. Generally, however, memory system 20 may comprise any suitable number of memory devices of any desired type and size. Although the system configuration of FIG. 1 comprises multiple memory devices, some of the methods and systems described herein can also be used in memory systems having only a single memory device, e.g., a device having two or more planes.

Memory system 20 comprises a memory controller 32, which accepts data from host 24 and stores it in memory devices 28, and retrieves data from the memory devices and provides it to the host. Memory controller 32 comprises a host interface 36 for communicating with host 24, a memory interface 40 for communicating with memory devices 28, and a processor 44 that processes the stored and retrieved data. In some embodiments, memory controller 32 encodes the stored data with an Error Correction Code (ECC). In these embodiments, memory controller 32 comprises an ECC module 48, which encodes the data before stored in memory devices 28 and decodes the ECC of data retrieved from memory devices 28. In some embodiments, the memory controller verifies that a memory block has been programmed successfully by reading the encoded data from the memory block and verifying successful decoding of the ECC. The functions of processor 44 can be implemented, for example, using software running on the processor, using hardware (e.g., state machine or other logic), or using a combination of software and hardware elements.

Memory controller 32 communicates with memory devices 28 over a bus 46. Bus 46 may comprise any suitable link or bus such as a parallel bus or a serial bus, or a packet-based bus such as PCIe. Bus 46 may operate in accordance with any suitable standard or protocol, and at any suitable rate.

To apply a storage command to a given memory device, the memory controller sends the storage command to the memory device over bus 46. Types of storage commands include, for example, page write, page read and block erasure commands. The memory device executes the storage command internally, and sends back to the memory controller data and/or status information as specified by the command. The memory device typically indicates to the memory controller when the memory device is ready to accept subsequent commands. In some embodiments, memory system 20 supports storage commands that are applied to multiple memory devices in parallel. In some embodiments, the memory device indicates to the memory controller of a failing programming operation.

In some embodiments, the memory controller allocates multiple memory blocks in each die to operate in a SLC mode. Such memory blocks serve as a fast input buffer for receiving data from the memory controller. The memory device then programs the data in the SLC buffer to memory blocks operating in MLC or TLC mode, for example.

In some embodiments, the memory controller calculates redundancy data for recovering data stored in a memory block, wherein the stored data has been corrupted due to a subsequent programming operation in this memory block. In an embodiment, the memory controller stores the redundancy data in an auxiliary memory 50 that may comprise any suitable memory such as a Dynamic Random Access Memory (DRAM) 50. In another embodiment, the memory controller stores the redundancy data in one or more memory blocks of memory devices 28. When a memory block becomes fully programmed, the memory controller may discard the redundancy data associated with that memory block. The physical organization of the redundancy data written to the memory device is optimized for high performance and protection, e.g., by distributing the redundancy data among multiple physical dies and/or planes.

Memory controller 32, and in particular processor 44, may be implemented in hardware. Alternatively, the memory controller may comprise a microprocessor that runs suitable software, or a combination of hardware and software elements. In some embodiments, processor 44 comprises a general-purpose processor, which is programmed in software to carry out the functions described herein. The software may be downloaded to the processor in electronic form, over a network, for example, or it may, alternatively or additionally, be provided and/or stored on tangible media, such as magnetic, optical, or electronic memory.

The memory system configuration of FIG. 1 is an example configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

In the exemplary memory system configuration shown in FIG. 1, memory devices 28 and memory controller 32 are implemented as separate Integrated Circuits (ICs). In alternative embodiments, however, the memory devices and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which one or more of the memory devices are disposed. Further alternatively, some or all of the functionality of memory controller 32 can be implemented in software and carried out by a processor or other element of the host system, or by any other type of memory controller. In some embodiments, host 24 and memory controller 32 may be fabricated on the same die, or on separate dies in the same device package.

Recovering Data Corrupted During Programming

Figure 2:
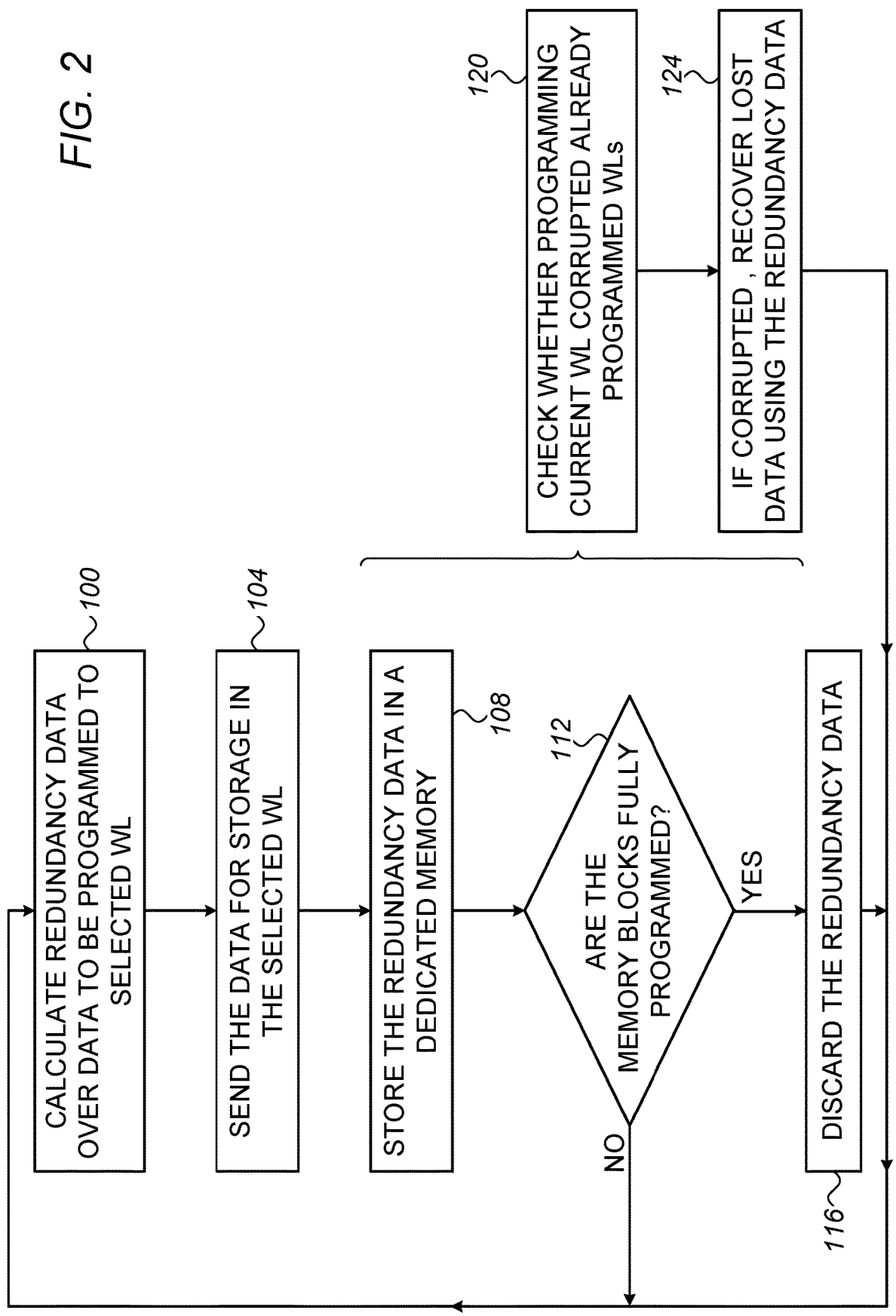
FIG. 2 is a flow chart that schematically illustrates a method for recovering data corrupted during programming, in accordance with an embodiment that is described herein.

FIG. 2 is a flow chart that schematically illustrates a method for recovering data corrupted during programming, in accordance with an embodiment that is described herein. The method is described as being executed by memory controller 32 of FIG. 1. In the present example, the underlying nonvolatile memory comprises a TLC device.

The method begins with the memory controller calculating redundancy data over data destined to be programmed, at a redundancy calculation step 100. In the present example, the data at step 100 may be destined for programming to a selected WL shared by a group of memory blocks across multiple planes. The controller calculates the redundancy data, for example, by applying a bit-wise XOR operation on the data stored among data pages destined to the respective planes. Alternatively, other suitable methods for calculating the redundancy data can also be used.

In some embodiments, at step 100, the memory controller calculates a separate redundancy page for each bit-significance level. For example, in the TLC device, the controller calculates three redundancy pages for the respective Least Bit significant (LSB), Most Bit Significant (MSB) and Upper Bit Significant (USB) data pages. In this case, the redundancy data for protecting a WL in TLC mode occupies three WLs programmed in SLC mode.

At a data programming step 104, the memory controller sends the data of step 100 to the nonvolatile memory for storage in the selected WL, in TLC mode. For example, the memory controller sends the data for programming in the selected WL across multiple planes in parallel. At a redundancy storage step 108, the memory controller stores the redundancy data calculated at step 100 in a dedicated memory.

In some embodiments, the dedicated memory comprises an auxiliary memory that is external to the nonvolatile memory and that is accessible to the memory controller. The auxiliary memory may comprise a volatile memory such as a Dynamic Random Access Memory (DRAM). Alternatively, the auxiliary memory comprises a fast nonvolatile memory such as a MRAM. In other embodiments, the dedicated memory is implemented within the nonvolatile memory. In such embodiments, the memory controller stores the redundancy data in one or more memory blocks. For example, in the TLC device, the memory controller allocates three memory blocks operating in SLC mode, for storing three redundancy pages per data page, as described above. Using SLC mode is advantageous because programming and reading in SLC mode is faster than in other storage modes such as MLC and TLC modes. Moreover, SLC mode provides higher endurance than the other storage modes (e.g., at least 30× higher endurance, compared to TLC mode) which is important because the same memory block operating in SLC mode is used for protecting a large number of programming operations to other memory blocks during the device lifetime.

At an occupancy checking step 112, the memory controller checks whether the memory blocks in the group are fully programmed. If the memory blocks are still partially programmed the method loops back to step 100, for programming subsequent data to the memory blocks. Otherwise, the memory blocks in the group are determined to be fully programmed, and the memory controller discards the redundancy data from the dedicated memory, at a discarding step 116. Following step 116, the method loops back to perform step 100 as described above.

In the context of the present disclosure and in the claims the phrase "discarding the redundancy data" means that the redundancy data is no longer needed in the dedicated memory. The memory controller may discard the redundancy data using any suitable method. In an example embodiment, the memory controller discards the redundancy data by allowing overwriting the redundancy data with other data. Alternatively, the memory controller may erase the redundancy data or allocate other storage space for storing subsequent redundancy data.

As noted above, programming a WL in a memory block can cause data corruption in one or more other WLs of that memory block. In a multi-plane die, in some embodiments a severe failure occurs in only one of the planes. Note, however, that by using a sufficiently large amount of redundancy information, memory blocks that fail in two or more planes can also be recovered. For example, in a four-plane device having planes denoted PLANE1 . . . PLANE4, the memory controller calculates first redundancy data for memory blocks in PLANE1 and PLANE3, and second redundancy data for memory blocks in PLANE2 and PLANE3, and stores both the first redundancy data and the second redundancy data in PLANE4. In another failure mode, in a multi-plane die, a single WL fails in multiple memory blocks across multiple respective planes. At a failure checking step 120, the memory controller checks whether programming the selected WL with the data sent at step 104 has corrupted data already programmed in other WLs in one of the memory blocks in the group. The memory controller may initiate step 120 after performing step 104 or 108, for example, as will be described below.

In general, there is a tradeoff between the protection level achieved using a selected amount of redundancy data, and available resources such as storage area in the nonvolatile memory and/or DRAM, performance goals such as high throughput, low latency and low power consumption. In some embodiments, the memory controller balances among the protection level, available system resources such as DRAM capacity and user experience level by storing certain amount of redundancy data. User experience level can be defined, in an embodiment, in terms of storage capacity, responsiveness, periods between successive battery recharge operations, and the like.

In some embodiments, at step 120, the memory controller detects such data corruption by receiving a program failure indication from the nonvolatile memory, also referred to herein as a "Program Status Failure" (PSF) indication. Using the program failure indication, the memory device indicates to the memory controller that the programming operation in question has failed to complete successfully, for any reason. The memory controller typically receives the program failure indication shortly after sending the data for storage at step 104 or after storing the redundancy data in the nonvolatile memory at step 108.

Alternatively or additionally, at step 120, the memory controller checks whether data corruption has occurred by reading and verifying the data in the fully programmed memory blocks, after detecting loop termination at step 112. The memory controller can verify the programmed data using any suitable method. In some embodiments, the data is programmed encoded using a suitable ECC within an ECC module (e.g., ECC module 48 in FIG. 1), applied at a data page level. The memory controller verifies the data by reading the data from the memory blocks and verifying that each encoded data page decodes successfully using the ECC. In some embodiments, the memory controller verifies all of the data programmed to the memory block. In other embodiments, the memory controller verifies only a portion of the data programmed to the memory block, thus shortening the verification overhead and increasing throughput.

At a recovery step 124, in response to detecting data corruption at step 120, the memory controller recovers the failing memory block using the redundancy data that was stored in the dedicated memory at step 108. In an embodiment, the controller removes the failing memory block from a pool of usable memory blocks, so that this memory block is not to be used for storing any subsequent data. Following step 124, the method loops back to steps 100 to store subsequent data to the memory blocks in the group.

Recovery Schemes in Programming and Reading

Figure 3:
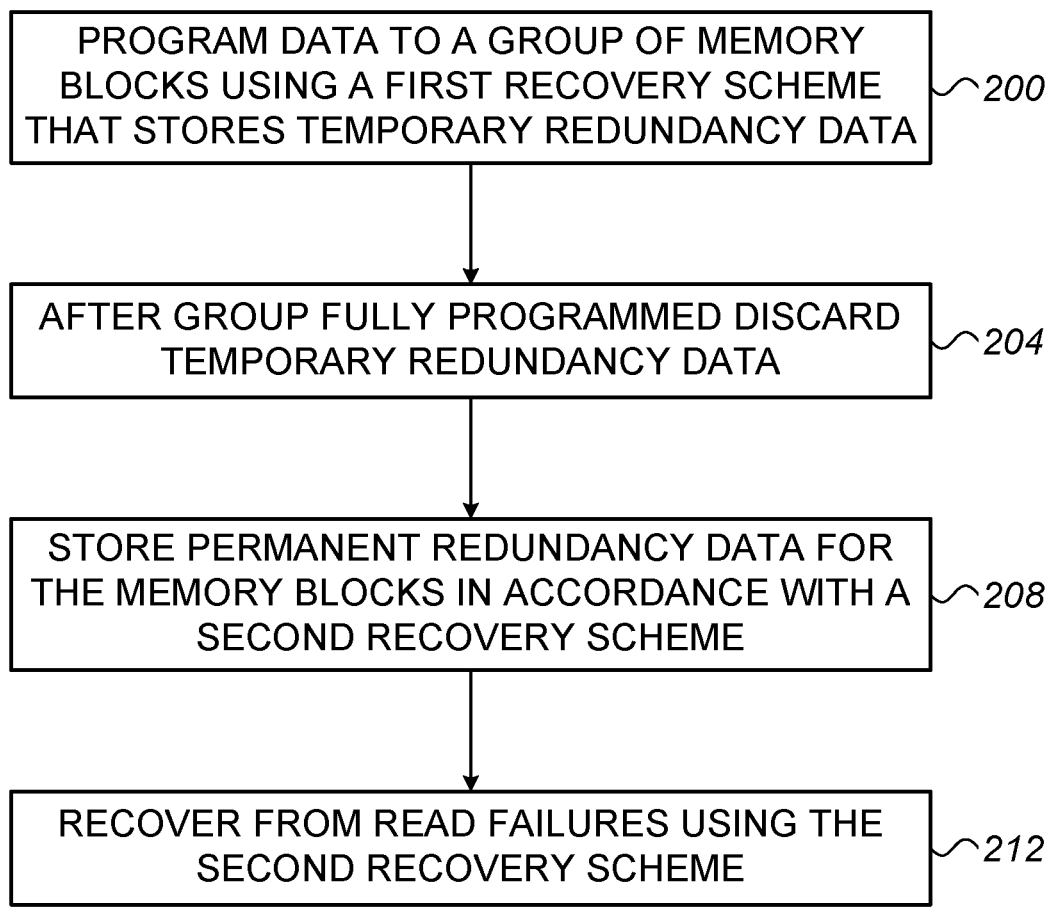
FIG. 3 is a flow chart that schematically illustrates a method for data recovery using different recovery schemes in programming and reading, in accordance with an embodiment that is described herein.

FIG. 3 is a flow chart that schematically illustrates a method for data recovery using different recovery schemes in programming and reading, in accordance with an embodiment that is described herein. The method will be described as being executed by memory controller 32 of FIG. 1.

The method begins with memory controller 32 programming data to a group of memory blocks, at a programming step 200, using a first recovery scheme. The memory controller may use for programming any suitable first recovery scheme, such as, for example, the method of FIG. 2 above. At step 200, the memory controller applies the first recovery scheme by calculating and storing temporary redundancy data in a dedicated memory. In case of a program failure that corrupts already programmed data, the memory controller recovers the data that has been lost using the temporary redundancy data.

At a discarding step 204, after the memory blocks in the group become fully programmed, the memory controller discards the temporary redundancy data from the dedicated memory. As will be described below, in some embodiments, the memory controller calculates permanent redundancy data from the temporary redundancy data. In such embodiments, the memory controller discards the temporary redundancy data at step 204 only after calculating the permanent redundancy data.

At a permanent redundancy calculation step 208, the memory controller calculates for the memory blocks in the group permanent redundancy data in accordance with a second recovery scheme, different from the first recovery scheme that was used in programming. Note that storing permanent redundancy at step 208 is not mandatory. In some embodiments, the memory controller uses only temporary redundancy data as described at step 200, and skips executing step 208.

In some embodiments, the permanent redundancy data occupies a storage space smaller than the temporary redundancy data. As such, the second recovery scheme has limited recovery capabilities, e.g., protecting only against common types of read failures. In an example embodiment, the first recovery scheme is designed for recovering any data loss pattern that occurs within a single memory block in the group, and in addition supports recovering a single WL failing across multiple planes, whereas the second recovery scheme is designed for recovering only a limited number of WLs failing in a single memory block. In some embodiments, at least one of the first and second recovery schemes supports recovering a single WL failing across multiple planes. Example recovery schemes that can be used for the second recovery scheme are described, for example, in U.S. Pat. No. 9,996,417, whose disclosure is incorporated herein by reference.

At a recovery step 212, the memory controller detects a failure in reading from one or more memory blocks in the group, and recovers the data whose reading has failed using the permanent redundancy data in accordance with the second recovery scheme. Following step 212, the method terminates. In some embodiments, the memory controller may retire a failing memory block from a pool of available memory blocks.

Figure 4:
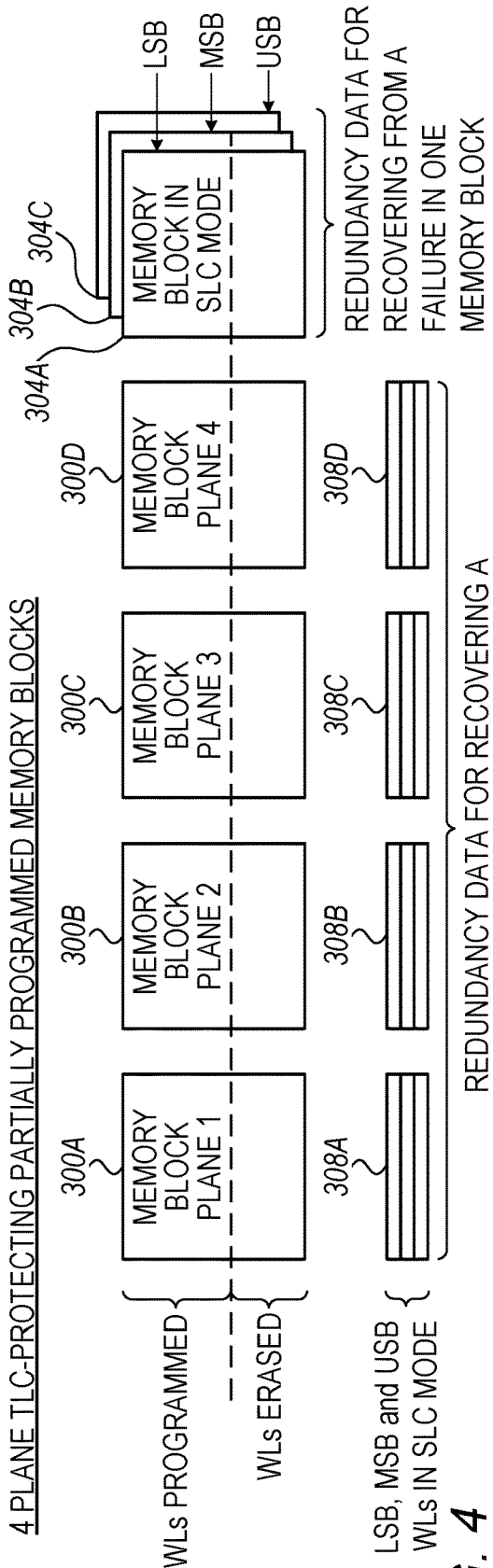
FIG. 4 is a diagram that schematically illustrates a redundancy scheme applied to partially programmed memory blocks in a multi-plane TLC device, in accordance with an embodiment that is described herein.

FIG. 4 is a diagram that schematically illustrates a redundancy scheme applied to partially programmed memory blocks in a multi-plane TLC device, in accordance with an embodiment that is described herein.

FIG. 4 depicts memory blocks 300A . . . 300D belonging to respective planes denoted PLANE1 . . . PLANE4 in the TLC memory device. The memory blocks are partially programmed, wherein WLs above and below the dashed line represent WLs that are already programmed with data, and WLs that are still erased, respectively. In the present example, the memory controller stores data to memory blocks 300 in TLC mode.

In FIG. 4, additional memory blocks 304A . . . 304C store redundancy data calculated by the memory controller for recovering data corrupted during the programming of memory blocks 300. In the present example, memory blocks 304A . . . 304C store the redundancy data in SLC mode, for improved speed and reliability. In the present example, memory blocks 300 store user data using a number of three bits per cell, whereas memory blocks 304 store redundancy data using only one bit per cell. In alternative embodiments, the memory blocks are programmed using the same number of bits per cell for user data and redundancy data, e.g., both using SLC mode.

For each WL storing LSB, MSB and USB data in memory blocks 300, the memory controller stores LSB, MSB and USB redundancy data in respective WLs of memory blocks 304A . . . 304C. For example, the controller calculates LSB redundancy data for a given WL by applying a bit-wise XOR operation between the LSB data stored in the given WL across PLANE1 . . . PLANE4, and stores the XOR result in a respective WL of memory block 304A. The controller calculates MSB and USB redundancy data in a similar manner and stores the MSB and USB redundancy data, in SLC mode, in respective memory blocks 304B and 304C.

Note that the present example refers to a TLC 2D configuration in which a row/WL stores 3 data pages—LSB, MSB, USB. In a 3D configuration, however, a row is comprised out of multiple strings and therefore a TLC 3D device having 8 strings would have 8*3=24 pages per row/WL. In general, the term WL refers to a physical row that may contain any suitable number of data pages.

In the example of FIG. 4, the redundancy scheme additionally protects against a failure mode in which one or more planes fail in a single WL. In some embodiments, to protect a single WL failure in multiple planes (possibly different WLs in different planes, e.g., depending on NVM technology and/or architecture) the memory controller calculates for each memory block 300 a bit-wise XOR over the WLs already programmed in the memory block, and the data of the WL currently being programmed. In some embodiments, the memory controller calculates separate redundancy data for LSB, MSB and USB. In FIG. 4 the memory controller stores LSB, MSB and USB redundancy data resulting by the XOR operations, in SLC mode, in WLs 308A . . . 308D (of another memory block, not shown) for the respective memory blocks 300A . . . 300D.

In response to detecting a single WL failure in programming one or more of memory blocks 300, the memory controller recovers the failing WL in each failing memory block 300 using the respective redundancy data in WLs 308. For example, the memory controller recovers a single WL failing in memory block 300B using the redundancy data stored in WLs 308B.

In some embodiments, the programming of a single WL fails across multiple planes that are programmed in parallel. In an embodiment, the memory controller recovers the failing WL in each of memory blocks 300A . . . 300D separately, as explained above. In alternative embodiments, the memory controller recovers the failing WL across all memory blocks 300 in the group, by retaining a copy of the WL content across these memory blocks 300 until verifying successful programming.

In some embodiments, the programming of a WL to memory blocks 300A . . . 300D in parallel, results in a program failure of this WL in multiple planes, and also in corrupting data already programmed in other WLs of one of memory blocks 300. To recover the lost data in this case, the memory controller first recovers the WL across the multiple planes, e.g., using the redundancy data in WLs 308, and then the memory controller recovers the corrupted data in the failing memory block (one of memory blocks 300A . . . 300D) using the redundancy data in memory blocks 304A . . . 304C.

Figure 5:
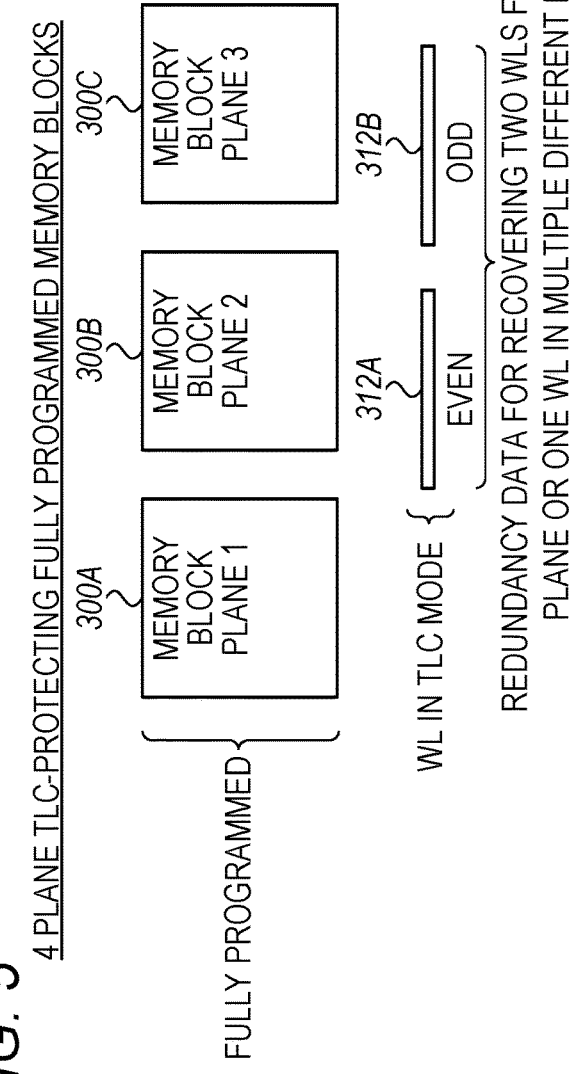
FIG. 5 is a diagram that schematically illustrates a redundancy scheme applied to fully programmed memory blocks in a multi-plane TLC device, in accordance with an embodiment that is described herein.

FIG. 5 is a diagram that schematically illustrates a redundancy scheme applied to fully programmed memory blocks in a multi-plane TLC device, in accordance with an embodiment that is described herein. The redundancy scheme in FIG. 5 can be used, for example in implementing steps 208 and 2012 of the method of FIG. 3 above.

In FIG. 5, memory blocks 300A . . . 300D are fully programmed. The memory controller applies a permanent redundancy scheme that protects against a failure of an even WL and/or an odd WL in reading one of memory blocks 300. The recovery scheme also protects against any WL failure in a single memory block when reading the WL across multiple planes in parallel, e.g., the WL fails in two or more planes out of the four planes. In the present example, the memory controller calculates even redundancy data over all the even WLs of memory blocks 300 and odd redundancy data over all the odd WLs of memory blocks 300. The memory controller calculates separate even and odd redundancy data, for LSB, MSB and USB data, and stores the resulting redundancy data in respective WLs 312A and 312B of another memory block (not shown), in TLC mode.

In some embodiments, the memory controller stores the temporary redundancy data that is discarded after the programming of memory blocks in a volatile memory. In the example of FIG. 4, during the programming of memory blocks 300, the memory controller stores the redundancy data of memory blocks 304 and WLs 308 in a DRAM, which provides fast access, no write endurance degradation (as in NVM) and low power consumption compared to the nonvolatile memory device.

When programming the memory blocks completes, e.g., as shown with reference to memory blocks 300 in FIG. 5, the memory controller calculates small-sized permanent redundancy data from the redundancy data in the DRAM. In the present example, the memory controller calculates a bit-wise XOR over the data in the DRAM corresponding to the even WLs of memory blocks 304 to produce the even redundancy WL 312A. Similarly, the memory controller calculates a bit-wise XOR over the data in the DRAM corresponding to the odd WLs of memory blocks 304 to produce the odd redundancy WL 312B.

In an alternative embodiment, the memory controller stores the temporary redundancy data in the nonvolatile memory, and calculates the permanent redundancy data from the temporary redundancy data, e.g., using bit-wise XOR operations.

Note that in general, the controller may calculate the permanent redundancy data directly from the data stored in the nonvolatile memory and not from the temporary redundancy data.

Calculating the permanent redundancy data from the temporary redundancy data in the DRAM using XOR operations is very efficient because it requires no access to the nonvolatile memory. The controller may also elect to calculate the permanent redundancy data based on the original programmed data. This is beneficial in cases in which volatile memory resources are limited or in cases in which the temporary and/or permanent redundancy data is based on encoding the original data using, for example, Reed-Solomon or Low-Density Parity-Check (LDPC) error correction schemes. To calculate the permanent redundancy data from the temporary redundancy data may require the memory controller to read any part and any combination of the temporary redundancy data and the original user data stored in the protected block.

Using Spare Memory Blocks for Storing Redundancy Data

In some embodiments, memory device 28 (e.g., a die) comprises multiple spare memory blocks that provide extra storage space over the nominal storage space specified for the memory device. The memory controller may use the spare memory blocks for various purposes such as garbage collection and buffering. In some example embodiments, the memory controller configures one or more of the spare memory blocks to operate in SLC mode for storing in the memory device data received from the memory controller. Such a buffer is sometimes referred to as a "SLC buffer."

The memory controller can use spare memory blocks for storing redundancy data during programming in various ways. For example, in an embodiment, the memory controller (e.g., the Flash Translation Layer running on the controller) allows having up to a predefined number of concurrent memory-block groups (e.g., four groups or less) in which the memory blocks are not fully programmed. A group of memory blocks that are partially programmed is also referred to as an "open group." The storage space required for the temporary redundancy data is typically proportional to the actual number of open groups. When the number of open groups is sufficiently small, the memory controller can use memory blocks from the pool of spare memory blocks for storing the temporary redundancy data during programming, in an embodiment.

In some embodiments, when the memory blocks in the group become fully programmed, the memory controller retains the redundancy data stored in spare memory blocks instead of discarding this redundancy data. This full redundancy data may provide better recovery capabilities than a recovery scheme typically used for protecting fully programmed memory blocks against read failures. In some embodiments, the memory controller retains the full redundancy data as long as the spare memory blocks are not required for other purposes. For example, at start of life, the number of spare memory blocks available is relatively large and the memory controller retains the full redundancy data, whereas later in the device's lifetime, when the spare memory blocks are sparse, the memory controller discards the redundancy data and applies a suitable recovery scheme for the fully programmed blocks.

In some embodiments, some of the memory blocks intended for user data remain unused, at least temporarily. The memory controller uses such memory blocks for storing redundancy data, in a similar manner to the spare memory blocks, as described above. Upon user demand, the memory controller returns these memory blocks for storing user data instead of the redundancy data. Since the resource of spare memory blocks is limited, usage of available data memory blocks offers a higher level of protection when the user partition is not full.

The embodiments described above are given by way of example, and other suitable embodiments can also be used. For example, although some of the embodiments above were described with reference to a TLC device, these embodiments are similarly applicable to any suitable device other than TLC, such as a SLC device, MLC device and QLC device. In the embodiments described above, we refer mainly to calculating redundancy data using bit-wise XOR operations. This, however, is not mandatory, and other methods for calculating the redundancy data can also be used. For example, the memory controller may calculate redundancy data using ECC methods such as Reed Solomon or Low-Density Parity-Check (LDPC) encoding. The redundancy schemes described in FIGS. 4 and 5 were given by way of example, and any other suitable redundancy schemes, having other recovery capabilities, can also be used.

Power Loss Management

In some embodiments, as noted above, the memory controller saves the temporary redundancy in a volatile memory such as a DRAM. In one embodiment, when the operating power supplied to the memory system is shut down or unexpectedly lost, the memory controller performs a controlled shut-down process, in which the memory controller copies the temporary redundancy data from the volatile memory to the memory device, e.g., in SLC mode, for speed and reliability. In an alternative embodiment, the temporary redundancy data for protecting a group of memory blocks being programmed in SLC mode is stored in a volatile memory (e.g., DRAM). Upon power loss, the memory controller copies the redundancy data to one or more nonvolatile memory blocks, e.g., in TLC, MLC or QLC mode, rather than in SLC mode to save nonvolatile storage space. When the power supply resumes, the memory controller recovers the temporary redundancy data from the memory device back to the volatile memory.

In another embodiment, when temporary redundancy data stored in the volatile memory is lost due to a sudden power failure, when the power supply resumes, the memory controller may attempt recovering the lost temporary redundancy data using the data programmed, which this temporary redundancy was calculated to protect. A recovery scheme that recovers the temporary redundancy data based on the programmed data is possible when the data has been programmed correctly. Since the probability that power loss occurs when a memory block that is not yet fully programmed has corrupted data is low, this recovery scheme provides protection in most practical cases, but does not aim to provide absolute protection in case of sudden power loss.

In some embodiments, the memory system comprises a Solid-State Drive having a large storage volume. In such embodiments, a fast nonvolatile memory such as a Magnetic RAM (MRAM) memory or a 3D XPoint (3DXP) memory can be used for buffering data to be programmed to the SSD. In these embodiments, the memory controller stores temporary redundancy data in this nonvolatile buffer, which data is retained upon shut down or sudden power loss.

Alternatively, when sufficient storage space and parallelism are available, the memory controller employs an extensive RAID scheme, in which case the memory controller does not implement the temporary redundancy data approach.

In some embodiments, the probability of power loss event during programming a memory block that is partially programmed is assumed sufficiently low, and therefore the memory controller omits the recovery of the redundancy data upon waking up as described above.

Considerations in Selecting Target Memory for Storing Redundancy Data

In this section it is assumed that in memory system 20, memory devices 28 comprise nonvolatile memory devices, which are collectively referred to herein as a "nonvolatile storage."

In some embodiments, the memory controller stores temporary redundancy data in the nonvolatile storage or in auxiliary memory 50, which resides externally to the nonvolatile storage and is accessible to the memory controller. The temporary redundancy data is calculated for protecting partially programmed memory blocks. Although the embodiments that will be described below refer mainly to temporary redundancy data, these embodiments are similarly applicable to permanent redundancy data calculated for protecting fully programmed memory blocks in a SLC buffer before copied to the nonvolatile storage. Note that the memory controller typically stores long-term permanent redundancy data in the nonvolatile storage.

Selecting the actual memory for storing the temporary redundancy data can be done once, e.g., at power up or initialization, or multiple times depending on varying conditions. Selecting the memory typically involves a tradeoff between conflicting requirements such as writing throughput and endurance vs. available storage space.

In some embodiments, the memory controller selects the memory for storing redundancy data based on the configuration of memory system 20. The configuration comprises, for example, accessing times and storage spaces of the auxiliary memory and the nonvolatile storage, the storage technology of the auxiliary memory, and the like.

In a massive storage system, such as a high density SSD, the memory controller stores long-term permanent redundancy data for block-level protection in the nonvolatile memory devices, with only little impact on performance and power consumption. For example, when one memory block in a group of a hundred memory blocks stores redundancy data for recovering a failing memory block in the group, throughput degrades and power consumption increases by about one percent.

In other embodiments, related to small or medium sized memory systems, the memory controller provides partial protection to a group of fully programmed memory blocks by storing in the nonvolatile memory devices a small-sized permanent redundancy data for recovering a number of WLs failing in a memory block, less than the entire WLs of the memory blocks.

The memory controller may write user data to the nonvolatile storage using various schemes. In some embodiments, the memory controller stores user data directly to the destined memory devices, in SLC, MLC, TLC or QLC mode. In other embodiments, the memory controller first stores the user data in a SLC buffer comprising multiple memory blocks of the nonvolatile storage, and that are programmed in SLC mode. At a later time, the memory controller copies the data pending in the SLC buffer to the destined memory devices in the nonvolatile storage using a suitable storage mode, e.g., TLC.

When the programming of data copied from the SLC buffer to the destined memory blocks fails, the memory controller recovers the failing data from the SLC buffer, in which the data is still valid. Therefore, the destined memory blocks need not be protected during programming. The data programmed to the SLC buffer, or directly to the target memory blocks, however, needs to be protected using a suitable redundancy scheme such as the schemes described above.

In an embodiment, the memory controller calculates permanent redundancy data for protecting data in the SLC buffer, before copying that data to the destined memory blocks. In an embodiment, the memory controller first stores the calculated permanent redundancy data in the auxiliary memory, and moves this permanent redundancy data for long-term storage in the nonvolatile storage when the relevant memory block is fully programmed and the content programmed to the memory block has been verified. Alternatively, the memory controller stores the permanent data for data pending in the SLC buffer directly in the nonvolatile storage.

In some embodiments, the memory controller may be required to update or replace data pending in the SLC buffer before copied to the destined memory blocks. In such embodiments, copying the data from the SLC buffer to the destined memory blocks is omitted.

As noted above, the memory controller may store temporary redundancy data in the nonvolatile storage, or in the auxiliary memory. In some embodiments, the auxiliary memory comprises any suitable type of volatile memory such as a DRAM. In other embodiments, the auxiliary memory comprises any suitable type of nonvolatile memory, such as a MRAM.

Storing the temporary redundancy data in auxiliary memory 50 is in some cases advantageous, because accessing the auxiliary memory is typically much faster than accessing nonvolatile memory devices 28, resulting in a higher throughput of the memory system. In addition, the endurance of the nonvolatile memory devices improves because the memory controller performs a smaller number of erasure and programming cycles to the nonvolatile memory devices. Since, however, the memory controller typically uses the auxiliary memory for various purposes, the auxiliary memory may not be always available for storing redundancy data.

In embodiments in which auxiliary memory 50 comprises a volatile memory, temporary redundancy data that is stored in the auxiliary memory may be vulnerable to power loss events. Alternatively, the memory controller stores the temporary redundancy data in the nonvolatile storage, which is resilient to power loss. Extensive usage of the nonvolatile storage may, however, reduce the endurance (e.g., the number of erasure and programming cycles that the nonvolatile storage sustains) and the write throughput of the memory system.

In some embodiments, the memory controller selects the nonvolatile storage or auxiliary memory for storing temporary redundancy data once, e.g., at initialization. Such a selection is predetermined, or based on system configuration parameters, such as the storage capacities and speeds of the auxiliary memory and the nonvolatile memory devices, the number of spare memory blocks available, and the like.

As an example, in a SSD comprising four-plane or eight-plane devices, and assuming a memory block of 24 Mbytes, storing temporary redundancy data for a multiplane stripe in the DRAM, may improve the SSD sequential write performance by 20%, and improve the endurance of the nonvolatile storage by 10%, compared to storing the temporary redundancy data in the nonvolatile storage. Conversely, storing the temporary redundancy data in the nonvolatile storage, and not in the DRAM, may result in a saving of 20% of the DRAM storage space (e.g., the DRAM may have a storage space of 1 gigabyte.)

In some embodiments, the memory controller selects the auxiliary memory or the nonvolatile storage for storing the temporary redundancy data based on varying conditions. In some embodiments, the memory controller selects the memory for storing the temporary redundancy data based on a criterion that aims to maximize the writing throughput to the nonvolatile storage, the endurance of the nonvolatile storage, or both.

In an embodiment, over some time period, the memory controller may store temporary redundancy data in only one of the auxiliary memory and the nonvolatile storage, or in both. The memory controller may move temporary redundancy data between the auxiliary memory and the nonvolatile storage, e.g., based on evaluating storage space availability in at least one of the nonvolatile storage and the auxiliary memory.

In some embodiments, the memory controller holds (e.g., in the auxiliary memory) a translation table for translating between logical addresses used by the host, and physical addresses used for accessing the nonvolatile memory devices. Over time, e.g., when the host randomly writes data to the nonvolatile memory devices, the translation table may become fragmented, and therefore occupies a large storage space. In an embodiment, the memory controller selects to store temporary redundancy data in the auxiliary memory or in the nonvolatile storage based on the fragmentation level of the translation table. The controller may estimate the fragmentation level based on the table size. In an embodiment, in response to detecting that the fragmentation level exceeds a predefined level, the memory controller stores recently calculated temporary redundancy data in the nonvolatile storage. Additionally or alternatively, the memory controller moves some or all of the temporary data currently stored in the auxiliary memory to the nonvolatile storage, to free some storage space for the fragmentation table.

In some embodiments, the memory controller selects to store temporary redundancy data in the auxiliary memory or in the nonvolatile storage based on system-level requirements. For example, when the auxiliary memory comprises a volatile memory, and resilience to power loss events is required, the memory controller stores the temporary redundancy data in the nonvolatile storage. Alternatively, the auxiliary memory comprises a nonvolatile memory, in which case the memory controller selects between the nonvolatile auxiliary memory and the nonvolatile storage based on other considerations, such as, for example, memory footprint considerations, as described above.

In some embodiments, the memory controller allocates in the auxiliary memory a given storage space to be shared between (i) a write buffer for storing data pending programming to the nonvolatile memory and (ii) a storage area for storing redundancy data. The memory controller estimates a writing rate to the write buffer, and re-allocates the write buffer and the storage area, based on the estimated writing rate.

Although in some of the embodiments described above, the auxiliary memory comprises a DRAM, this is not mandatory, and other suitable storage technologies can also be used. For example, in some embodiments, the auxiliary memory comprises a nonvolatile memory such as a MRAM or a 3D XPoint memory, which are fast nonvolatile memories. MRAM typically requires a higher write power than DRAMs. The 3D Xpoint memory typically has a higher storage density than DRAMs. An auxiliary memory implemented as a MRAM or a 3D Xpoint memory is resilient against sudden power loss events, because these types of storage devices are nonvolatile.

In some embodiments, the auxiliary memory comprises any suitable secondary storage system that is accessible to the memory controller directly or via the host. The secondary storage system may comprise, for example, a cache drive, a nonvolatile memory card such as Secure-Digital (SD) card, or a USB thumb drive.

Although the embodiments described herein mainly address recovering data that is corrupted in programming a memory system, the methods and systems described herein can also be used in other applications, such as in a memory server comprising multiple memory systems. In such embodiments, temporary redundancy data, to be used for protecting memory blocks that are corrupted during programming in one or more memory systems, is stored in other memory systems of the memory server.

As another example, the memory controller may use the methods described above for protecting a persistent memory such as a Nonvolatile Dual In-line Memory Module (NVDIMM) accessible by the memory controller. A NVDIMM may comprise a combination of a fast volatile memory such as a DRAM plus a nonvolatile memory. The NVDIMM may comprise any suitable memory type, such as a MRAM or 3D XPoint memory. A NVDIMM-based storage system may comprise multiple DIMMs of multiple respective different DIMM types. The disclosed embodiments may be applied to the nonvolatile memory, for example, by storing temporary redundancy data in the DRAM part to protect the programming of memory blocks of the NVM part of the NVDIMM.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A controller, comprising:
an interface, which is configured to communicate with a nonvolatile memory comprising multiple memory cells organized in multiple memory blocks, wherein each memory block comprises multiple Word Lines (WLs) of the memory cells; and
a processor, configured to:
receive first data, and store the first data in one or more WLs of a given memory block, wherein the first data occupies less than a maximal number of WLs available in the given memory block;
calculate redundancy data over the first data, and store the redundancy data in a dedicated memory;
receive second data and program the second data to a selected WL of the given memory block that was not programmed with the first data;
check a programming status resulting from the programming of the selected WL;
in response to identifying that programming the second data to the selected WL has corrupted at least part of the first data, recover the first data using the redundancy data; and
in response to identifying that programming the second data has filled the given memory block completely, calculate for the given memory block permanent redundancy data, smaller than the redundancy data, and store the permanent redundancy data in the nonvolatile memory.

2. The controller according to claim 1, wherein in response to identifying that the second data has been programmed successfully and that programming the second data has filled the given memory block completely, the processor is configured to discard the redundancy data from the dedicated memory.

3. The controller according to claim 1, wherein the processor is configured to identify that programming the second data has corrupted the first data by receiving a program failure indication from the nonvolatile memory.

4. The controller according to claim 1, wherein the processor is configured to identify that programming the second data has corrupted the first data by reading and verifying the first data.

5. The controller according to claim 1, wherein the memory blocks support programming a first number of bits per memory cell, wherein the dedicated memory comprises one or more selected memory blocks in the nonvolatile memory, and wherein the processor is configured to program the redundancy data to the one or more selected memory blocks using a second number of bits per memory cell smaller than or equal to the first number.

6. The controller according to claim 1, wherein the dedicated memory comprises an auxiliary nonvolatile memory, which resides externally to the nonvolatile memory and is accessible to the controller.

7. The controller according to claim 1, wherein the dedicated memory comprises an auxiliary volatile memory, wherein the processor is configured to recover the redundancy data after system power is lost and then resumes, by recovering the redundancy data based on the first data, and storing the recovered redundancy data in the volatile memory.

8. The controller according to claim 1, wherein the memory blocks are organized in multiple planes whose WLs are accessible in parallel, and wherein the processor is configured to calculate multiple plane-specific redundancy chunks for respective memory blocks belonging to different respective planes.

9. The controller according to claim 8, wherein the processor is configured to recover a WL whose programming to multiple memory blocks in multiple respective planes has failed, using the multiple plane-specific redundancy chunks.

10. The controller according to claim 1, wherein the processor is configured to calculate the redundancy data by applying bit-wise XOR operations among WLs programmed with the first data, and to calculate the permanent redundancy data by applying bit-wise XOR operations over the redundancy data.

11. The controller according to claim 1, wherein the processor is configured to calculate the permanent redundancy data from the redundancy data by reading at least part of the first data from the memory block, and applying ECC encoding to the redundancy data and to the at least part of the first data that was read.

12. The controller according to claim 1, wherein the processor is configured to allocate at least a portion of a storage space of the dedicated memory from a predefined pool of multiple spare memory blocks.

13. The controller according to claim 1, wherein the dedicated memory comprises the nonvolatile memory or an auxiliary memory accessible to the controller, wherein the processor is configured to select a memory for storing the redundancy data, between the nonvolatile memory and the auxiliary memory, and to store the redundancy data in the selected memory.

14. The controller according to claim 13, wherein the controller and the nonvolatile memory are comprised in a storage system, wherein the processor is configured to select the memory for storing the redundancy data, at power up, based on a configuration of the storage system.

15. The controller according to claim 13, wherein the processor is configured to select the memory for storing the redundancy data based on a criterion that aims to maximize at least one of (i) a writing throughput to the nonvolatile memory and (ii) a number of programming and erasure cycles that the nonvolatile memory sustains.

16. The controller according to claim 13, wherein the processor is configured to move at least some of redundancy data previously written to one of the nonvolatile memory and the auxiliary memory to the other one of the nonvolatile memory and the auxiliary memory, based on evaluating storage space availability in at least one of the nonvolatile memory and the auxiliary memory.

17. The controller according to claim 13, wherein the processor is configured to hold a table for translating between logical addresses used by a host coupled to the controller and physical addresses used by the nonvolatile memory, to check a fragmentation level of the table, and in response to detecting that the fragmentation level exceeds a predefined fragmentation threshold, to select the nonvolatile memory for storing the redundancy data.

18. The controller according to claim 13, wherein the processor is configured to allocate in the auxiliary memory a given storage space to be shared between (i) a write buffer for storing data pending programming to the nonvolatile memory and (ii) a storage area for storing redundancy data, to estimate a writing rate to the write buffer, and to re-allocate the write buffer and the storage area, based on the estimated writing rate.

19. A method for data storage, comprising:
in a controller that communicates with a nonvolatile memory comprising multiple memory cells organized in multiple memory blocks, wherein each memory block comprises multiple Word Lines (WLs) of the memory cells,
receiving first data, and storing the first data in one or more WLs of a given memory block, wherein the first data occupies less than a maximal number of WLs available in the given memory block;
calculating redundancy data over the first data, and storing the redundancy data in a dedicated memory;
receiving second data and programming the second data to a selected WL of the given memory block that was not programmed with the first data;
checking a programming status resulting from the programming of the selected WL;
in response to identifying that programming the second data to the selected WL has corrupted at least part of the first data, recovering the first data using the redundancy data; and
in response to identifying that programming the second data has filled the given memory block completely, calculating for the given memory block permanent redundancy data, smaller than the redundancy data, and storing the permanent redundancy data in the nonvolatile memory.

20. The method according to claim 19, wherein in response to identifying that the second data has been programmed successfully and that programming the second data has filled the given memory block completely, discarding the redundancy data from the dedicated memory.

21. The method according to claim 19, wherein identifying that programming the second data has corrupted the first data comprises receiving a program failure indication from the nonvolatile memory.

22. The method according to claim 19, wherein identifying that programming the second data has corrupted the first data comprises reading and verifying the first data.

23. The method according to claim 19, wherein the memory blocks support programming a first number of bits per memory cell, wherein the dedicated memory comprises one or more selected memory blocks in the nonvolatile memory, and wherein storing the redundancy data comprises programming the redundancy data to the one or more selected memory blocks using a second number of bits per memory cell smaller than or equal to the first number.

24. The method according to claim 19, wherein the memory blocks are organized in multiple planes whose WLs are accessible in parallel, and wherein calculating the redundancy data comprises calculating multiple plane-specific redundancy chunks for respective memory blocks belonging to different respective planes.

25. The method according to claim 19, wherein the dedicated memory comprises the nonvolatile memory or an auxiliary memory accessible to the controller, and comprising selecting a memory for storing the redundancy data, between the nonvolatile memory and the auxiliary memory, and storing the redundancy data in the selected memory.

26. The method according to claim 19, wherein selecting the memory for storing the redundancy data comprises selecting the memory based on a criterion that aims to maximize at least one of (i) a writing throughput to the nonvolatile memory and (ii) a number of programming and erasure cycles that the nonvolatile memory sustains.

* * * * *